(12) United States Patent
Lee et al.

(10) Patent No.: US 10,910,419 B2
(45) Date of Patent: Feb. 2, 2021

(54) IMAGE SENSOR

(71) Applicant: SAMSUNG ELECTRONICS CO., LTD., Gyeonggi-do (KR)

(72) Inventors: Gwideok Ryan Lee, Suwon-si (KR); Taeyon Lee, Seoul (KR); Sangchun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/418,557

(22) Filed: May 21, 2019

(65) Prior Publication Data

US 2020/0161348 A1     May 21, 2020

(30) Foreign Application Priority Data

Nov. 16, 2018 (KR) .................. 10-2018-0141526

(51) Int. Cl.
| | | |
|---|---|---|
| *H01L 27/146* | (2006.01) | |
| *H01L 31/032* | (2006.01) | |
| *H04N 5/374* | (2011.01) | |
| *H01L 29/786* | (2006.01) | |
| *H01L 29/417* | (2006.01) | |

(52) U.S. Cl.
CPC .... *H01L 27/14614* (2013.01); *H01L 27/1463* (2013.01); *H01L 29/41725* (2013.01); *H01L 29/7869* (2013.01); *H01L 31/032* (2013.01); *H04N 5/374* (2013.01)

(58) Field of Classification Search
CPC ......... H01L 21/02414; H01L 21/02483; H01L 21/02565; H01L 29/7869; H01L 31/022483; H01L 27/14614; H01L 31/032; H01L 27/1463; H01L 29/41725; H01L 27/1222; H01L 27/127; H01L 29/78696; H01L 29/42384; H01L 27/1225; H01L 27/14636; H01L 27/14609; H01L 27/14605; H01L 27/14612; H04N 5/374
See application file for complete search history.

(56) References Cited

U.S. PATENT DOCUMENTS

| | | | |
|---|---|---|---|
| 7,550,798 B2 | 6/2009 | Kwak | |
| 8,187,919 B2 | 5/2012 | Seo et al. | |
| 9,825,075 B2 | 11/2017 | Park | |
| 2008/0054319 A1* | 3/2008 | Mouli | H01L 27/14609 257/292 |
| 2014/0339548 A1* | 11/2014 | Yamazaki | H01L 29/78696 257/43 |
| 2015/0340401 A1* | 11/2015 | Yoshii | H01L 28/40 257/43 |
| 2016/0233340 A1* | 8/2016 | Shimomura | H01L 29/42384 |
| 2016/0373634 A1 | 12/2016 | Moon | |
| 2018/0054579 A1 | 2/2018 | Kumagai | |

FOREIGN PATENT DOCUMENTS

| | | |
|---|---|---|
| KR | 10-1016552 B1 | 2/2011 |
| KR | 10-2017-0077469 A | 7/2017 |

* cited by examiner

*Primary Examiner* — Julia Slutsker
(74) *Attorney, Agent, or Firm* — Sughrue Mion, PLLC

(57) ABSTRACT

An image sensor is provided and includes a semiconductor substrate having a first conductivity type, a photoelectric conversion region in the semiconductor substrate and having a second conductivity type, an oxide semiconductor pattern adjacent to a first surface of the semiconductor substrate, and a transfer gate on the first surface and adjacent to the photoelectric conversion region and the oxide semiconductor pattern.

19 Claims, 17 Drawing Sheets

IMAGE SENSOR

CROSS-REFERENCE TO RELATED APPLICATION

This U.S. nonprovisional application claims priority under 35 U.S.C § 119 from Korean Patent Application No. 10-2018-0141526 filed on Nov. 16, 2018 in the Korean Intellectual Property Office, the entire contents of which are hereby incorporated by reference.

BACKGROUND

1. Field

The present disclosure relates to an image sensor, and more particularly, to an image sensor including an oxide semiconductor pattern.

2. Description of Related Art

An image sensor is a semiconductor device to convert optical images into electrical signals. The image sensor may be classified into a charge coupled device (CCD) type and a complementary metal oxide semiconductor (CMOS) type. The CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

It is an aspect to provide an image sensor having improved integration and that is capable of performing a global shutter operation.

Aspects not limited to the mentioned above, and other aspects which have not been mentioned above will be clearly understood to those skilled in the art from the following description.

According to an aspect of some example embodiments there is provided an image sensor comprising a semiconductor substrate having a first conductivity type; a photoelectric conversion region in the semiconductor substrate and having a second conductivity type; an oxide semiconductor pattern adjacent to a first surface of the semiconductor substrate; and a transfer gate on the first surface and adjacent to the photoelectric conversion region and the oxide semiconductor pattern.

According to another aspect of some example embodiments, there is provided an image sensor comprising a semiconductor substrate having a first surface and a second surface facing the first surface; a first device isolation pattern between the first surface and the second surface, the first device isolation pattern defining a pixel; an oxide semiconductor pattern in the pixel and adjacent to the first surface; and a transfer gate between the oxide semiconductor pattern and the first device isolation pattern.

According to another aspect of some example embodiments, there is provided an image sensor comprising a semiconductor substrate having a first surface and a second surface facing each other; a photoelectric conversion region in the semiconductor substrate; an oxide semiconductor pattern in a recess that is recessed from the first surface toward the second surface; and a transfer gate on the first surface and adjacent to the oxide semiconductor pattern.

According to another aspect of some example embodiments, there is provided an image sensor comprising a semiconductor substrate having a first surface; a photoelectric conversion region in the semiconductor substrate; an indium-gallium-zinc oxide (IGZO) semiconductor pattern in the semiconductor substrate that has a top surface coplanar with the first surface and is spaced apart from the photoelectric conversion region to form a first space that partially defines a channel region; and a transfer gate on the first surface, wherein the IGZO semiconductor pattern receives charges from the photoelectric conversion region through the channel region.

DETAILED DESCRIPTION

Figure 1:
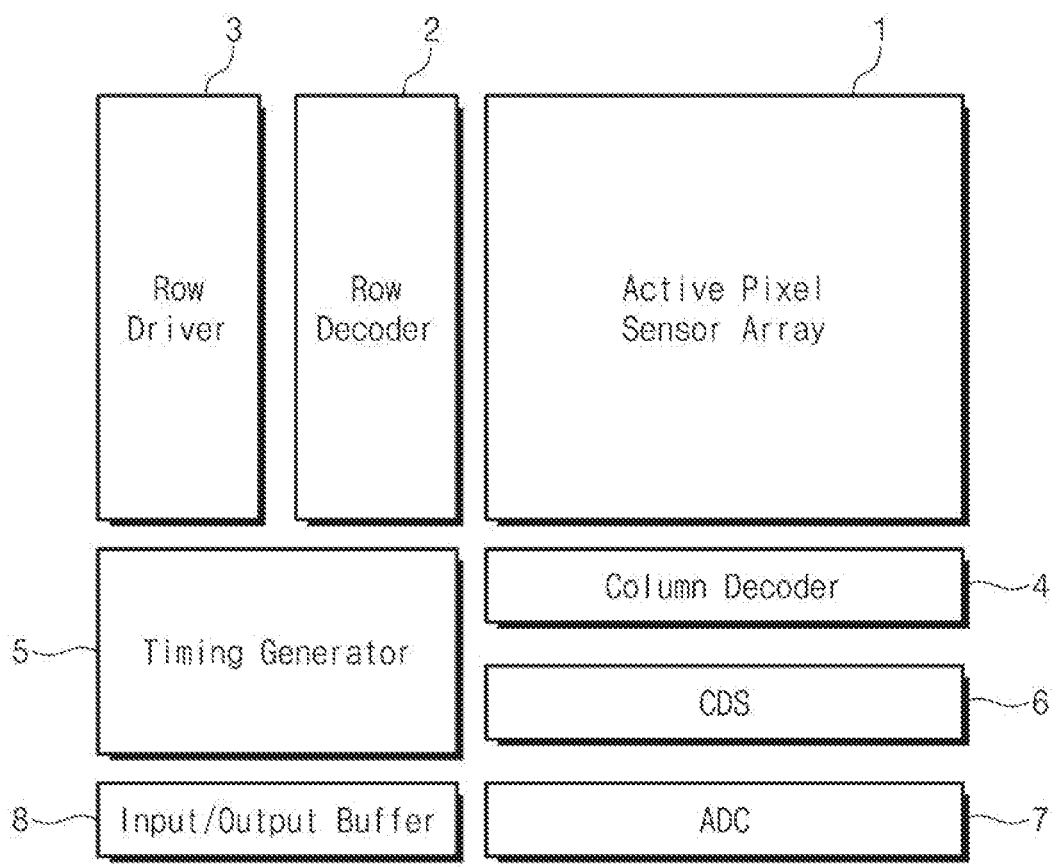
FIG. 1 illustrates a block diagram showing an image sensor according to some example embodiments.

FIG. 1 illustrates a block diagram showing an image sensor according to some example embodiments.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output buffer 8.

The active pixel sensor array 1 may include a plurality of two-dimensionally arranged unit pixels. The active pixel sensor array 1 may receive external light and convert the external light into electrical signals. The active pixel sensor array 1 may be driven by a plurality of driving signals such as a pixel select signal, a reset signal, and a charge transfer signal from the row driver 3. The correlated double sampler 6 may be provided with the converted electrical signals.

The row driver 3 may provide the active pixel sensor array 1 with several driving signals for driving several unit pixels in accordance with a decoded result obtained from the row decoder 2. In case that the unit pixels are arranged in a matrix shape, the driving signals may be provided for respective rows.

The timing generator 5 may provide timing and control signals to the row decoder 2 and the column decoder 4.

The correlated double sampler (CDS) 6 may receive the electrical signals generated from the active pixel sensor array 1, and hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter (ADC) 7 may convert analog signals, which correspond to the difference level received from the correlated double sampler 6, into digital signals and then output the converted digital signals.

The input/output buffer 8 may latch the digital signals and then sequentially output the latched digital signals to an image signal processor (not shown) in response to the decoded result obtained from the column decoder 4.

Figure 2:
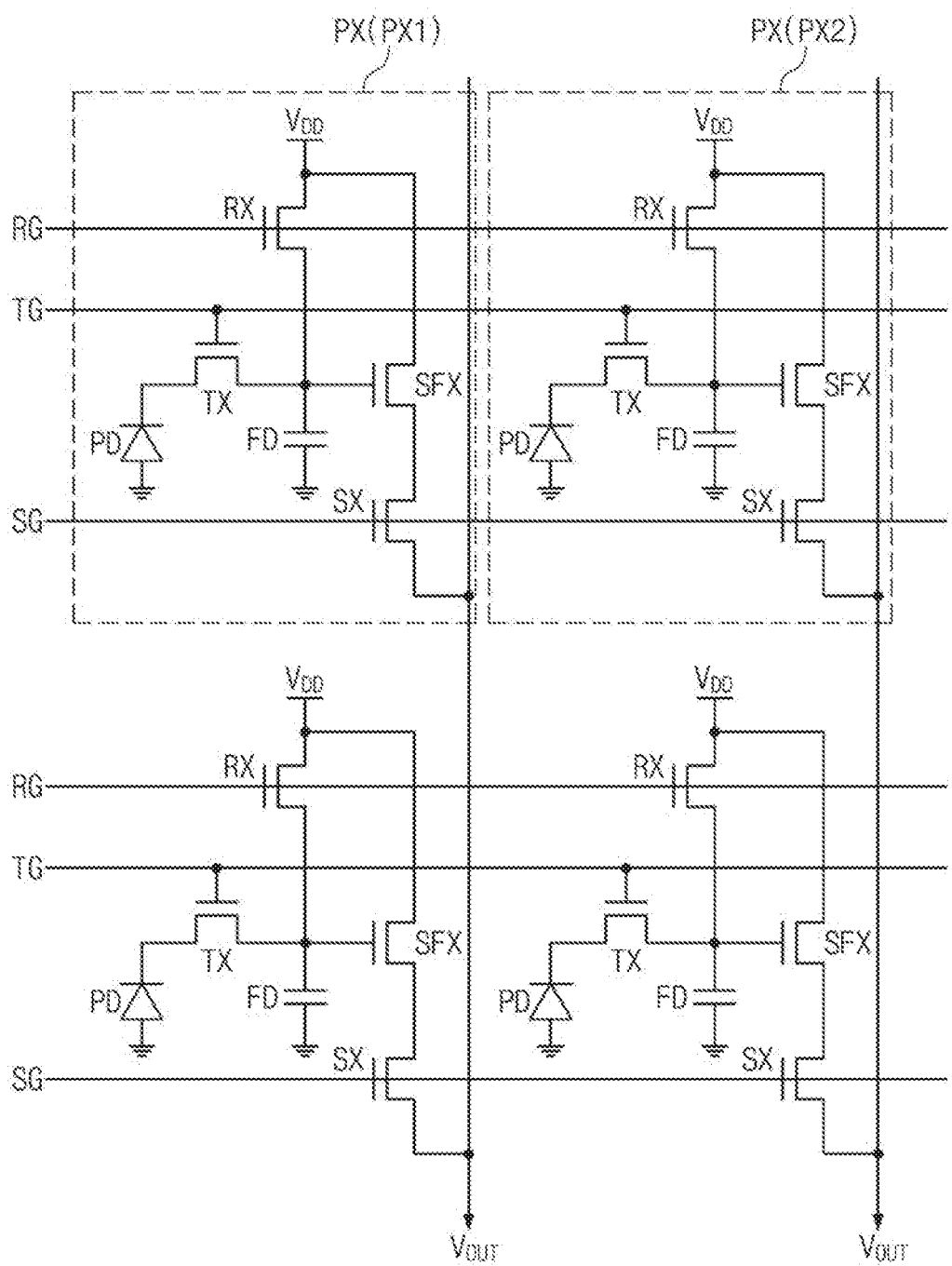
FIG. 2 illustrates a circuit diagram showing an active pixel sensor array of an image sensor according to some example embodiments.

Referring to FIGS. 1 and 2, the active pixel sensor array 1 may include a plurality of unit pixels PX, which unit pixels PX may be arranged in a matrix shape. Each of the unit pixels PX may include a transfer transistor TX and logic transistors RX, SX, and SFX. The logic transistors RX, SX, and SFX may include a reset transistor RX, a select transistor SX, and a source follower transistor SFX. The transfer transistor TX may include a transfer gate TG. Each of the unit pixels PX may further include a photoelectric conversion device PD and a charge storage node FD.

The photoelectric conversion device PD may create photo-charges in proportion to an amount of externally incident light. The photoelectric conversion device PD may include a photodiode, a phototransistor, a photogate, a pinned photodiode, or a combination thereof. The transfer transistor TX may transfer charges generated from the photoelectric conversion device PD into the charge storage node FD. The charge storage node FD may accumulatively store charges generated and transferred from the photoelectric conversion device PD. The source follower transistor SFX may be controlled by an amount of photo-charges accumulated in the charge storage node FD.

The reset transistor RX may periodically reset the charges accumulated in the charge storage node FD. The reset transistor RX may have a drain electrode connected to the charge storage node FD and a source electrode connected to power voltage VDD. When the reset transistor RX is turned on, the charge storage node FD may be supplied with the power voltage VDD connected to the source electrode of the reset transistor RX. Accordingly, when the reset transistor RX is turned on, the charges accumulated in the charge storage node FD may be drained and then the charge storage node FD may be reset.

The source follower transistor SFX may serve as a source follower buffer amplifier. The source follower transistor SFX may amplify a variation in electrical potential of the charge storage node FD and output the amplified electrical potential to an output line VOUT.

The select transistor SX may select each row of the unit pixels P to be readout. When the select transistor SX is turned on, the output line VOUT may output an electrical signal that is output from the drain electrode of the source follower transistor SFX.

Figure 3:
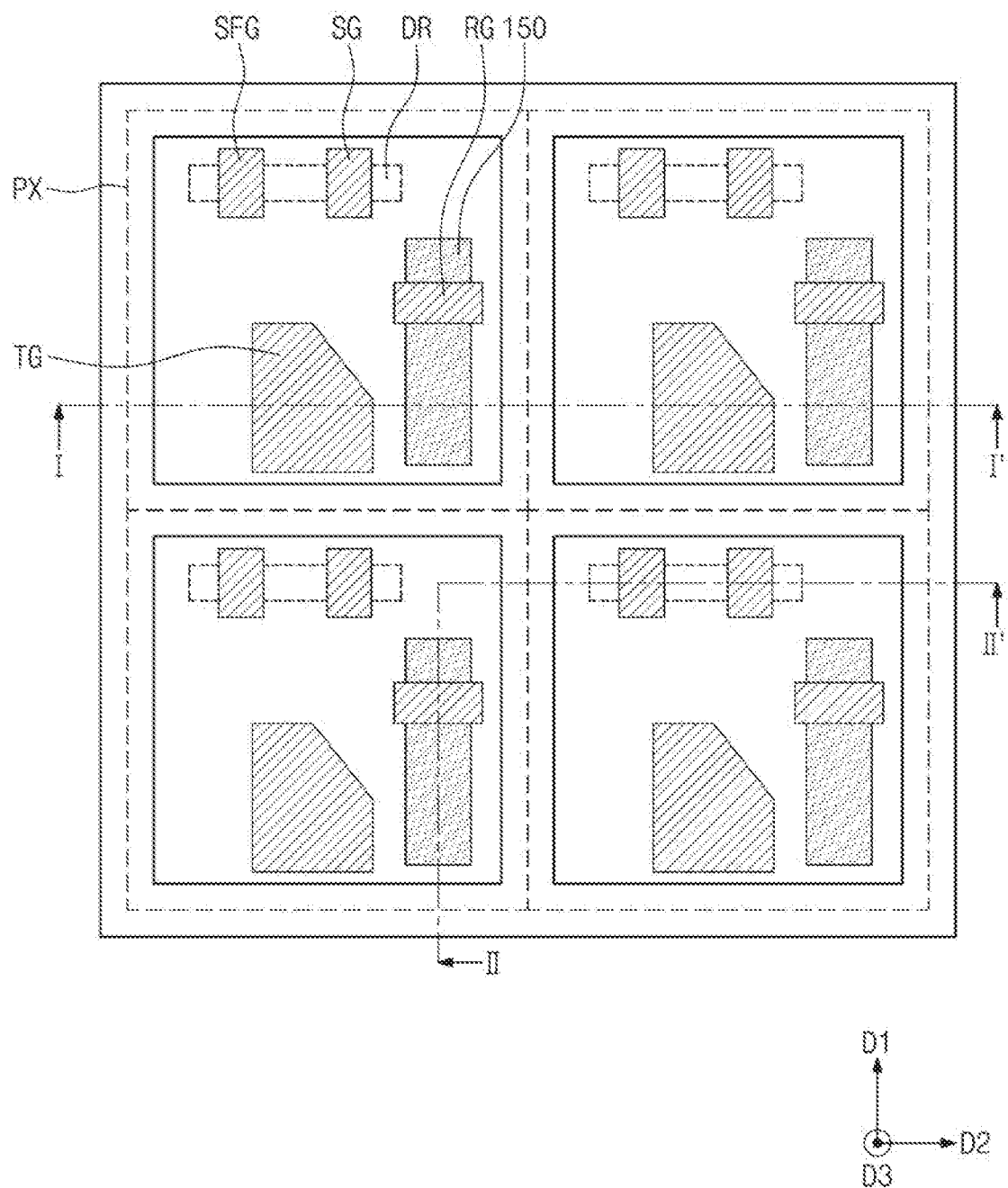
FIG. 3 illustrates a plan view showing an image sensor according to some example embodiments.
Figure 4A:
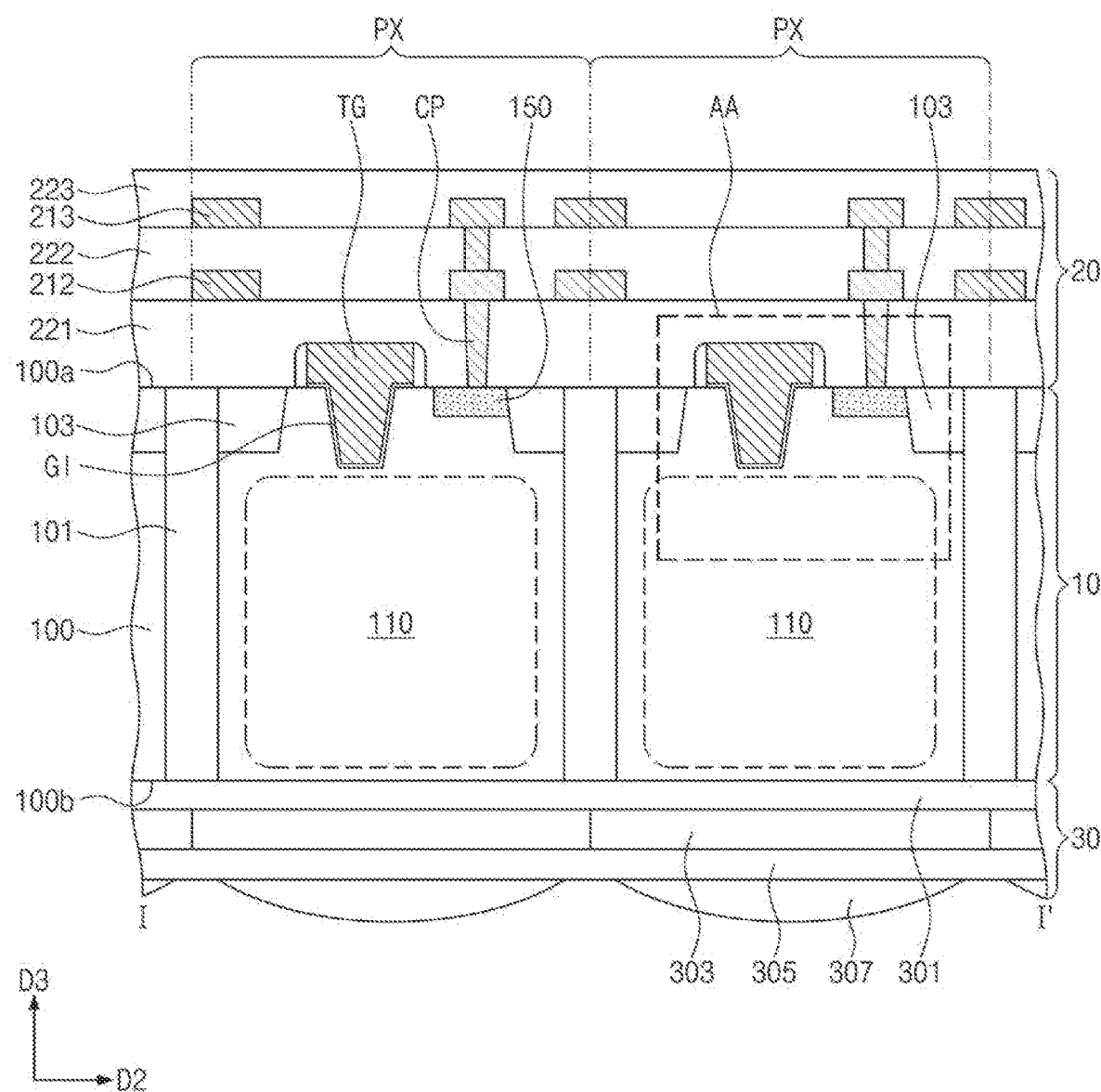
FIGS. 4A and 4B illustrate cross-sectional views respectively taken along lines I-I' and II-II' of FIG. 3.
Figure 4B:
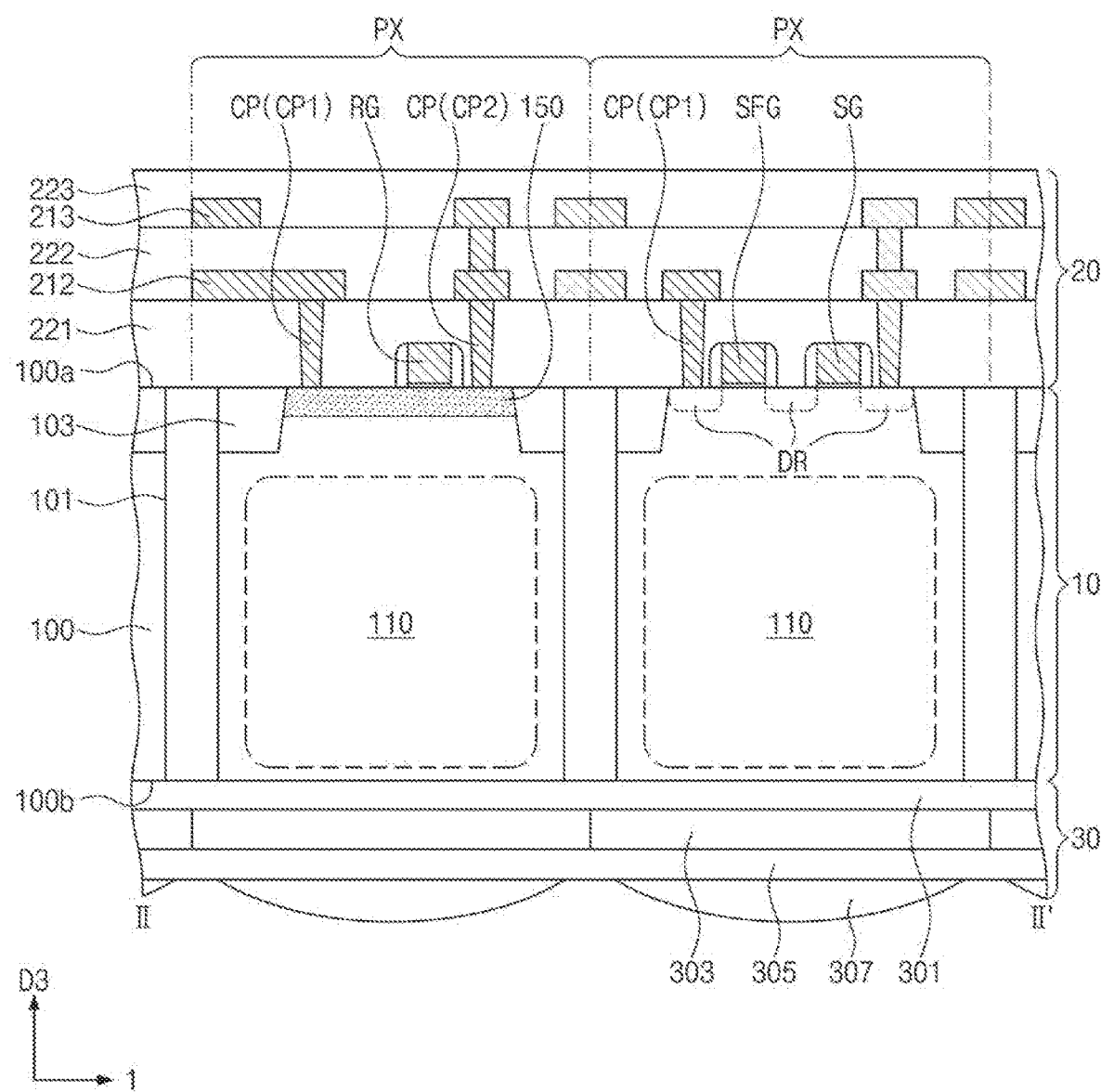
Figure 5A:
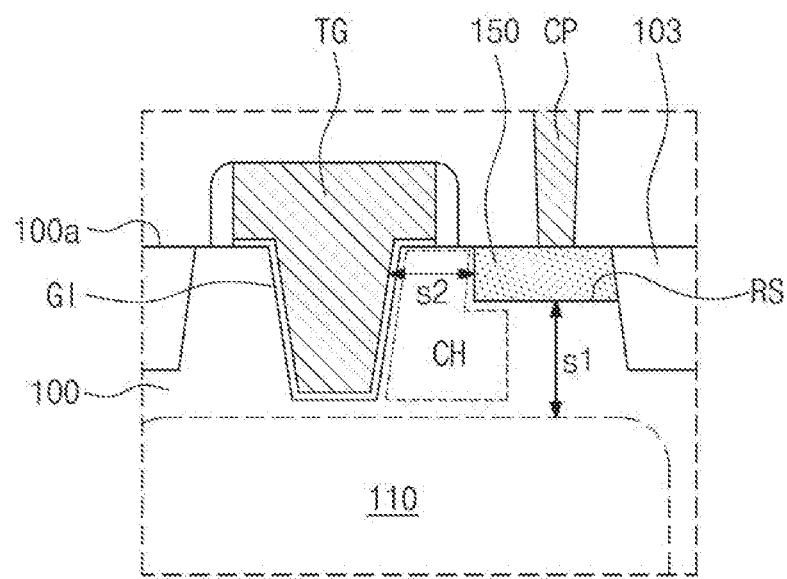
FIG. 5A illustrates an enlarged view of section AA shown in FIG. 4A.

FIG. 3 illustrates a plan view showing an image sensor according to some example embodiments. FIGS. 4A and 4B illustrate cross-sectional views respectively taken along lines I-I' and II-II' of FIG. 3. FIG. 5A illustrates an enlarged view of section AA shown in FIG. 4A.

Referring to FIGS. 3, 4A, 4B, and 5A, an image sensor according to some embodiments may include a photoelectric conversion layer 10, a connection line layer 20, and a light transmittance layer 30 (best seen in FIGS. 4A and 4B). In certain embodiments, the photoelectric conversion layer 10 may be interposed between the connection line layer 20 and the light transmittance layer 30.

The photoelectric conversion layer 10 may include a semiconductor substrate 100, photoelectric conversion regions 110 provided in the semiconductor substrate 100, and oxide semiconductor patterns 150 vertically overlapping the photoelectric conversion regions 110. The photoelectric conversion layer 10 may receive light that passes through the light transmittance layer 30. The photoelectric conversion regions 110 may convert the received light into electrical signals. The oxide semiconductor patterns 150 may accumulate the electrical signals transferred from the photoelectric conversion regions 110.

The connection line layer 20 may include first connection lines 212 and second connection lines 213. Contact pugs CP in a first interlayer dielectric layer 221 may be used to connect the first and second connection lines 212 and 213 to the transfer transistors TX and the logic transistors RX, SX, and SFX that are discussed above with reference to FIG. 2. The first and second connection lines 212 and 213 may be disposed in a second interlayer dielectric layer 222 and a third interlayer dielectric layer 223, respectively, stacked on a first surface 100a of the semiconductor substrate 100. The first surface 100a will be discussed below.

The light transmittance layer 30 may include color filters 303 and micro-lenses 307, and a first planarized layer 301 and a second planarized layer 305. The light transmittance layer 30 may condense and filter externally incident light, and the photoelectric conversion layer 10 may be provided with the condensed and filtered light.

The semiconductor substrate 100 may have the first surface 100a and a second surface 100b facing each other. The first surface 100a of the semiconductor substrate 100 may be adjacent to the connection line layer 20, and the second surface 100b of the semiconductor substrate 100 may be adjacent to the light transmittance layer 30. The semiconductor substrate 100 may have a first conductivity type (e.g., p-type). For example, the semiconductor substrate 100 may include a bulk silicon substrate and an epitaxial layer having the first conductivity type formed on an upper portion of the bulk silicon substrate. For another example, the semiconductor substrate 100 may include a p-type epitaxial layer from which the bulk silicon substrate is removed. For another example, the semiconductor substrate 100 may be a substrate having a well of the first conductivity type.

The semiconductor substrate 100 may include a plurality of pixels PX defined by a first device isolation pattern 101. The plurality of pixels PX may be arranged in a matrix shape along first and second directions D1 and D2 intersecting each other (best seen in FIG. 3).

The first device isolation pattern 101 may be provided between the first and second surfaces 100a and 100b of the semiconductor substrate 100. The first device isolation pattern 101 may be a deep device isolation pattern provided inside the semiconductor substrate 100. The first device isolation pattern 101 may run across the semiconductor substrate 100 along a third direction D3. The first device isolation pattern 101 may have one end and another end that are respectively exposed at the first and second surfaces 100a and 100b of the semiconductor substrate 100. Differently from that shown, in some embodiments, the first device isolation pattern 101 may not completely run across the semiconductor substrate 100. For example, the one end of the first device isolation pattern 101 may be spaced apart from the first surface 100a of the semiconductor substrate 100 by a first distance. As another example, alternatively or additionally, the other end of the first device isolation pattern 101 may be spaced apart from the second surface 100b of the semiconductor substrate 100 by a second distance. The first device isolation pattern 101 may prevent photo-charges generated from light incident onto each pixel PX from randomly drifting into neighboring pixels PX. The first device isolation pattern 101 may accordingly suppress a cross-talk phenomenon between the pixels PX.

The first device isolation pattern 101 may include a dielectric material whose refractive index is less than that of the semiconductor substrate 100. For example, the semiconductor substrate 100 may be include a silicon material. The first device isolation pattern 101 may include a single dielectric layer or a plurality of dielectric layers. The first device isolation pattern 101 may include, for example, a silicon oxide layer, a silicon oxynitride layer, or a silicon nitride layer.

The photoelectric conversion regions 110 may be disposed in corresponding pixels PX. The photoelectric conversion regions 110 may be doped with impurities having a second conductivity type (e.g., n-type) opposite to that of the semiconductor substrate 100. The photoelectric conversion regions 110 may be adjacent to the second surface 100b of the semiconductor substrate 100 and spaced apart from the first surface 100a of the semiconductor substrate 100. Each of the photoelectric conversion regions 110 may have a difference in impurity concentration between an area adjacent to the first surface 100a and an area adjacent to the second surface 100b. Thus, each of the photoelectric conversion regions 110 may have a potential slope between the first and second surfaces 100a and 100b of the semiconductor substrate 100.

The semiconductor substrate 100 and the photoelectric conversion regions 110 may constitute photodiodes. For example, the photodiode may be constituted by a p-n junction between the semiconductor substrate 100 having the first conductivity type and the photoelectric conversion region 110 having the second conductivity type. Each photoelectric conversion region 110 constituting the photodiode may create photo-charges from external light provided from outside the image sensor, accumulating the created photo-charges.

A second device isolation pattern 103 may be provided in the semiconductor substrate 100. The second device isolation pattern 103 may be a shallow device isolation pattern formed on the first surface 100a of the semiconductor substrate 100. The second device isolation pattern 103 may have a depth (i.e., in the direction D3) less than that of the first device isolation pattern 101.

The second device isolation pattern 103 may define an active section in each of the pixels PX. The active section may be an area for operation of transistors disposed on the first surface 100a of the semiconductor substrate 100. For example, the transistors may include the transistors TX, RX, SX, and/or SFX discussed with reference to FIG. 2. The second device isolation pattern 103 may include, for example, one or more of silicon oxide, silicon nitride, and silicon oxynitride.

The oxide semiconductor pattern 150 may be provided in the pixel PX. The oxide semiconductor pattern 150 may be adjacent to the first surface 100a of the semiconductor substrate 100. The oxide semiconductor pattern 150 may be disposed in a recess RS that is recessed from the first surface 100a toward the second surface 100b of the semiconductor substrate 100 (best seen in FIG. 5A). In this configuration, the oxide semiconductor pattern 150 may be buried in the semiconductor substrate 100, and may have a top surface exposed at the first surface 100a of the semiconductor substrate 100. For example, the top surface of the oxide semiconductor pattern 150 may be located at substantially the same level as that of the first surface 100a of the semiconductor substrate 100. In some embodiments, the top surface of the oxide semiconductor pattern 150 may be coplanar with the first surface 100a of the semiconductor substrate 100. The oxide semiconductor pattern 150 may have one lateral surface in contact with the second device isolation pattern 103 and another lateral surface in contact with a recessed inner lateral surface of the semiconductor substrate 100.

The oxide semiconductor pattern 150 may be spaced apart from the photoelectric conversion region 110 to form a first space s1. A channel region CH may be provided between the oxide semiconductor pattern 150 and the photoelectric conversion region 110, an example of which is shown in FIG. 5A. In some embodiments, the space s1 may partially define the channel region CH. The oxide semiconductor pattern 150 may correspond to the charge storage node FD discussed with reference to FIG. 2. The oxide semiconductor pattern 150 may receive charges through the channel region CH from the photoelectric conversion region 110. The oxide semiconductor pattern 150 may accumulatively store the received charges The oxide semiconductor pattern 150 may be positioned beneath a reset gate RG (best seen in FIG. 4B). For example, the oxide semiconductor pattern 150 may extend in the first direction D1 parallel to the first surface 100a of the semiconductor substrate 100. The reset gate RG may run across the oxide semiconductor pattern 150 along the second direction D2. A first contact plug CP1 may be coupled to one end of the oxide semiconductor pattern 150, and a second contact plug CP2 may be coupled to the other end of the oxide semiconductor pattern 150, an example of which is shown in FIG. 4B. The oxide semiconductor pattern 150 may be connected through the first contact plug CP1 to a source follower gate SFG which will be discussed below. The oxide semiconductor pattern 150 may be supplied through the second contact plug CP2 with the power voltage VDD discussed above with reference to FIG. 2.

The oxide semiconductor pattern 150 may include an oxide semiconductor. The oxide semiconductor may be a metal oxide semiconductor. For example, the oxide semiconductor pattern 150 may include at least one of indium (In), gallium (Ga) zinc (Zn), and tin (Sn). The oxide semiconductor pattern 150 may be indium-gallium-zinc oxide (IGZO) that includes indium (In), gallium (Ga) zinc (Zn), and tin (Sn). The oxide semiconductor may be an amorphous oxide semiconductor. The oxide semiconductor pattern 150 may be, for example, amorphous indium-gallium-zinc oxide (a-IGZO). The oxide semiconductor pattern 150 may have superior charge storage characteristics to those of doped silicon. Accordingly, it may be possible to provide the image sensor capable of performing a global shutter operation and a sequent readout operation, even without a certain node formed between the photoelectric conversion device PD and a transfer gate TG which will be discussed below. A detailed operation of the image sensor according to some example embodiments will be further discussed below with reference to FIG. 8.

A transfer gate TG may be provided in each of the pixels PX. The transfer gate TG may be disposed on the first surface 100a of the semiconductor substrate 100, and may be adjacent to the photoelectric conversion region 110 and the oxide semiconductor pattern 150. For example, the transfer gate TG may be closer to the channel region CH defined by the photoelectric conversion region 110 and the oxide semiconductor pattern 150 (best seen in FIG. 5A). In some embodiments, the transfer gate TG may be spaced apart from a lateral surface of the oxide semiconductor pattern 150 to form a second space s2 therebetween. The channel region CH may partially extend into the second space s2. The transfer gate TG may include a lower part inserted into the semiconductor substrate 100 and an upper part protruding above the first surface 100a of the semiconductor substrate 100. A gate dielectric layer GI may be interposed between the transfer gate TG and the semiconductor substrate 100.

The transfer gate TG may be disposed between a first portion and a second portion of the first device isolation pattern 101, as shown in FIG. 4A. The first portion of the first device isolation pattern 101 may refer to one side wall of the first device isolation pattern 101 that is closer to the transfer gate TG than the oxide semiconductor pattern 150. In other words, the transfer gate TG may be disposed between the first portion of the first device isolation pattern 101 and the oxide semiconductor pattern 150. And the oxide semiconductor pattern 150 may be spaced apart from the second portion of the first device isolation pattern 101 with the second device isolation pattern 103 therebetween. The oxide semiconductor pattern 150 may be in contact with the second device isolation pattern 103.

A source follower gate SFG and a select gate SG may be disposed spaced part from each other in the pixel PX (best seen in FIG. 3). The source follower gate SFG and the select gate SG may be placed at an edge of the pixel PX. Impurity regions DR may be disposed adjacent to the first surface 100a of the semiconductor substrate 100 (best seen in FIG. 4B). The impurity regions DR may be placed on opposite sides of the source follower gate SFG and on opposite sides of the select gate SG. The impurity regions DR may serve as source/drain regions of the source follower gate SFG and the select gate SG. The impurity regions DR may be doped with impurities of the second conductivity type.

The color filters 303 and the micro-lenses 307 may be disposed on the second surface 100b of the semiconductor substrate 100. The color filters 303 may be placed on corresponding pixels PX. The micro-lenses 307 may be placed on corresponding color filters 303. The first planarized layer 301 may be disposed between the color filters 303 and the second surface 100b of the semiconductor substrate 100, and the second planarized layer 305 may be disposed between the color filters 303 and the micro-lenses 307.

The color filters 303 may include green, red, and blue color filters. Alternatively, the color filters 303 may have different colors such as cyan, magenta, or yellow.

Each of the micro-lenses 307 may have a convex shape to condense light incident onto the pixel PX. When viewed in plan, the micro-lenses 307 may overlap corresponding photoelectric conversion regions 110.

Figure 5B:
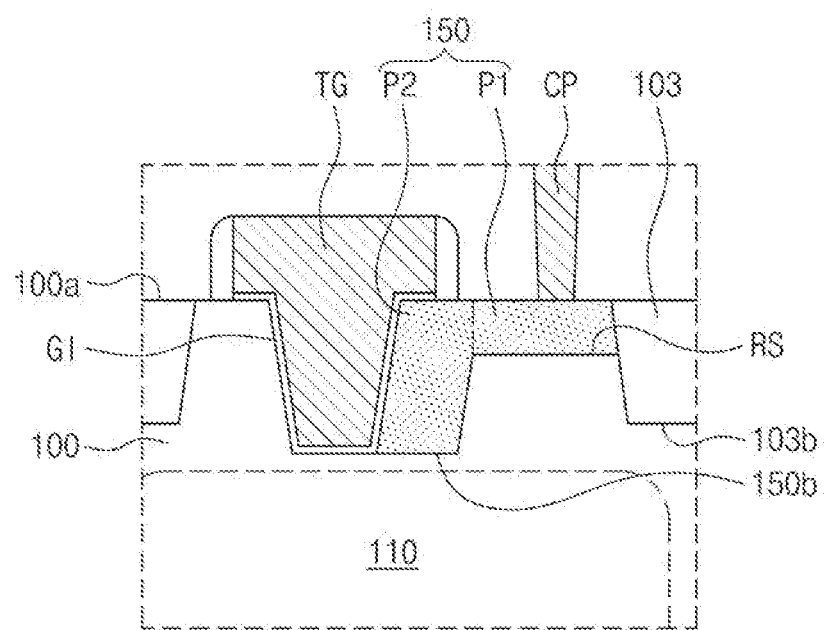
FIGS. 5B to 5D illustrate cross-sectional views corresponding to section AA of FIG. 4A, showing an image sensor according to some example embodiments.
Figure 5C:
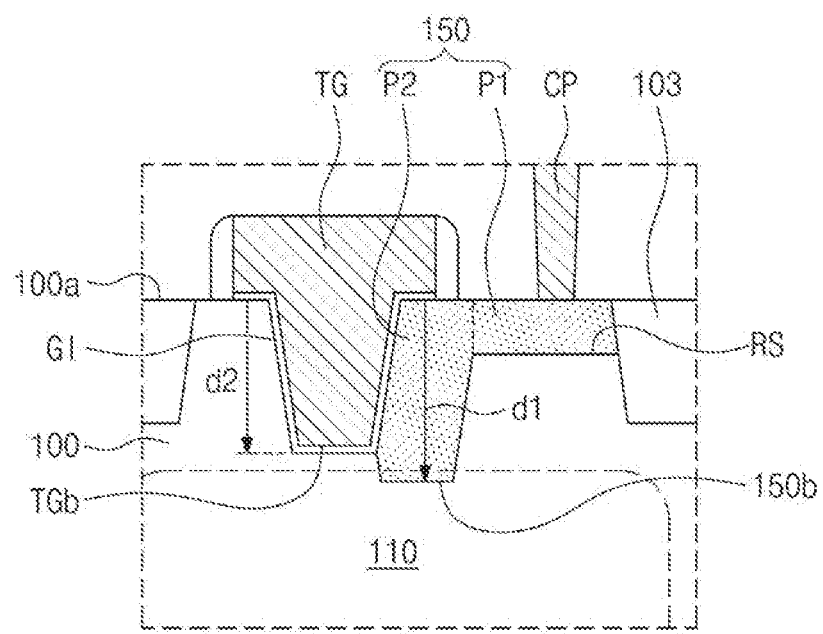
Figure 5D:
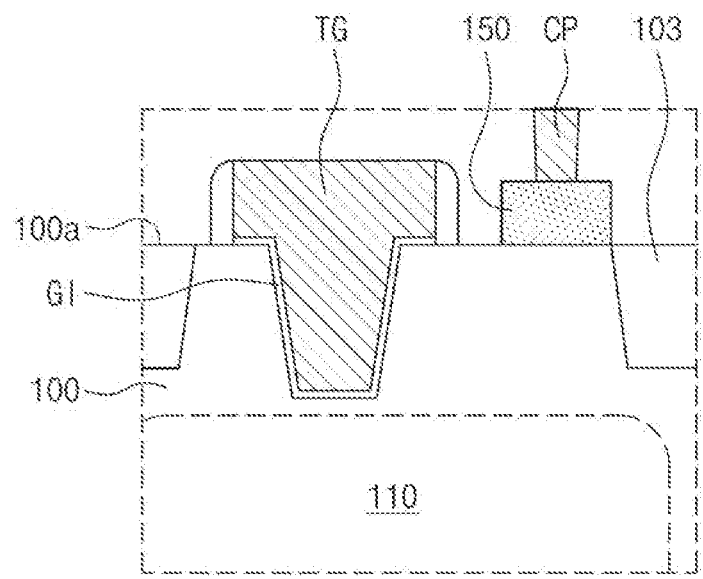

FIGS. 5B to 5D illustrate cross-sectional views corresponding to section AA of FIG. 4A, showing an image sensor according to some example embodiments. For brevity of description, explanations of duplicate components will be omitted.

Referring to FIGS. 4A and 5B, the oxide semiconductor pattern 150 may include a part that extends toward the second surface 100b of the semiconductor substrate 100. For example, the oxide semiconductor pattern 150 may include a first part P1 spaced apart from the transfer gate TG and a second part P2 extending from the first part P1. The second part P2 may be positioned between the transfer gate TG and the first part P1. The second part P2 may extend along a lower lateral surface of the transfer gate TG and toward the photoelectric conversion region 110. Thus, a portion of the oxide semiconductor pattern 150 may serve as a channel of the transfer transistor TX of FIG. 2. When the first surface 100a is defined as an active surface of the semiconductor substrate 100, a lowermost surface 150b of the second part P2 may be located at substantially the same level as a level of a lowermost surface of the transfer gate TG, or a level of a lowermost surface of the gate dielectric layer GI. The lowermost surface 150b of the second part P2 may correspond to a lowermost surface of the oxide semiconductor pattern 150. The lowermost surface 150b of the oxide semiconductor pattern 150 may be located at a lower level than a level of a lowermost surface 103b of the second device isolation pattern 103. In addition, the lowermost surface 150b of the second part P2 may be located at a lower level than a level of a lowermost surface of the first part P1 (pointed to by the leader line of RS in FIG. 5B). The second part P2 may be spaced apart from the photoelectric conversion region 110.

Referring to FIGS. 4A and 5C, in some embodiments, the oxide semiconductor pattern 150 may extend into the photoelectric conversion region 110. For example, a portion of the second part P2 of the oxide semiconductor pattern 150 may be positioned inside the photoelectric conversion region 110. When the first surface 100a is defined as an active surface of the semiconductor substrate 100, the lowermost surface 150b of the oxide semiconductor pattern 150 may be located at a lower level than a level of a lowermost surface TGb of the transfer gate TG. For example, a distance d1 between the first surface 100a and the lowermost surface 150b of the second part P2 may be greater than a distance d2 between the first surface 100a and the lowermost surface TGb of the transfer gate TG.

Referring to FIGS. 4A and 5D, in some embodiments, the oxide semiconductor pattern 150 may be disposed on the first surface 100a of the semiconductor substrate 100. For example, in this configuration, the oxide semiconductor pattern 150 may not be buried inside the semiconductor substrate 100. The top surface of the oxide semiconductor pattern 150 may be located at a higher level than a level of the first surface 100a of the semiconductor substrate 100.

Figure 6:
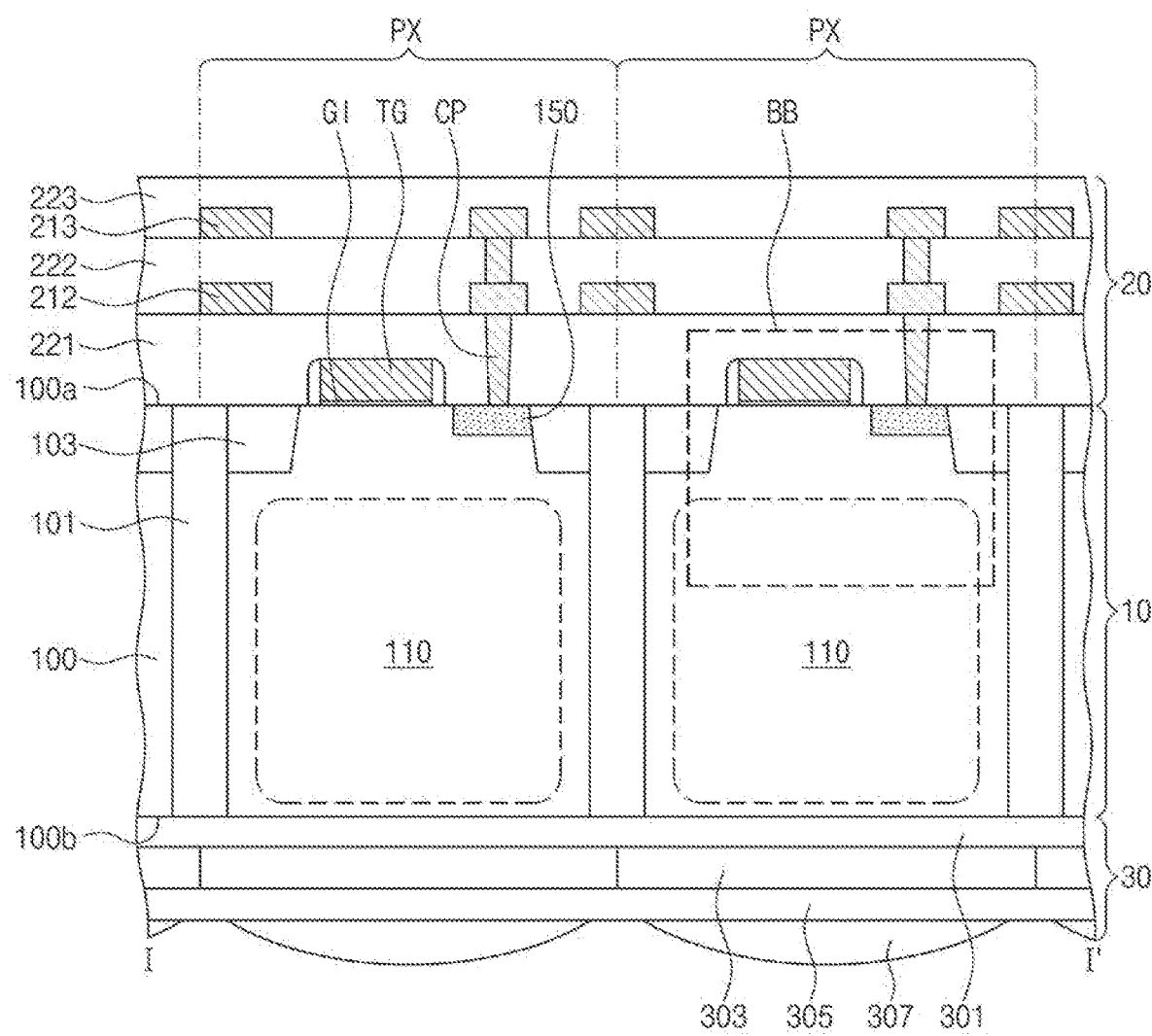
FIG. 6 illustrates a cross-sectional view taken along line I-I' of FIG. 3, showing an image sensor according to some example embodiments.
Figure 7A:
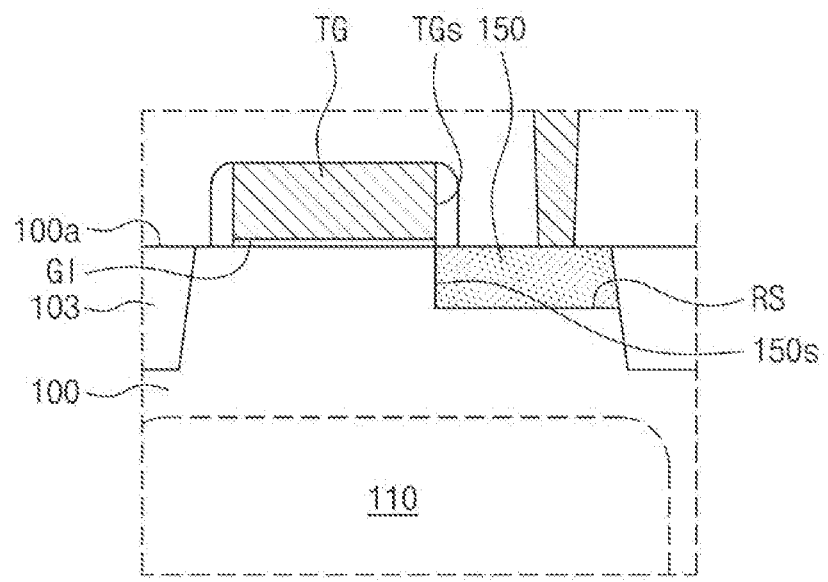
FIGS. 7A to 7C illustrate enlarged views of section BB shown in FIG. 6.
Figure 7B:
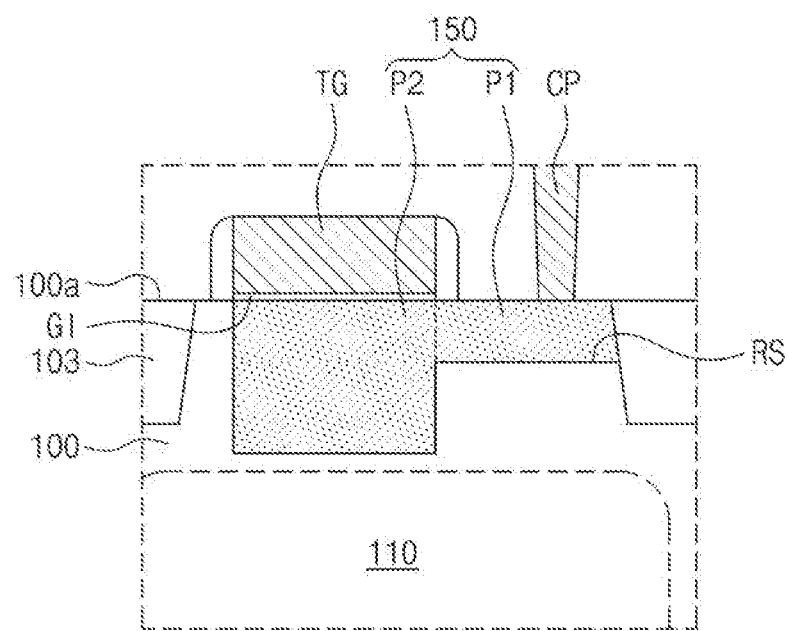
Figure 7C:
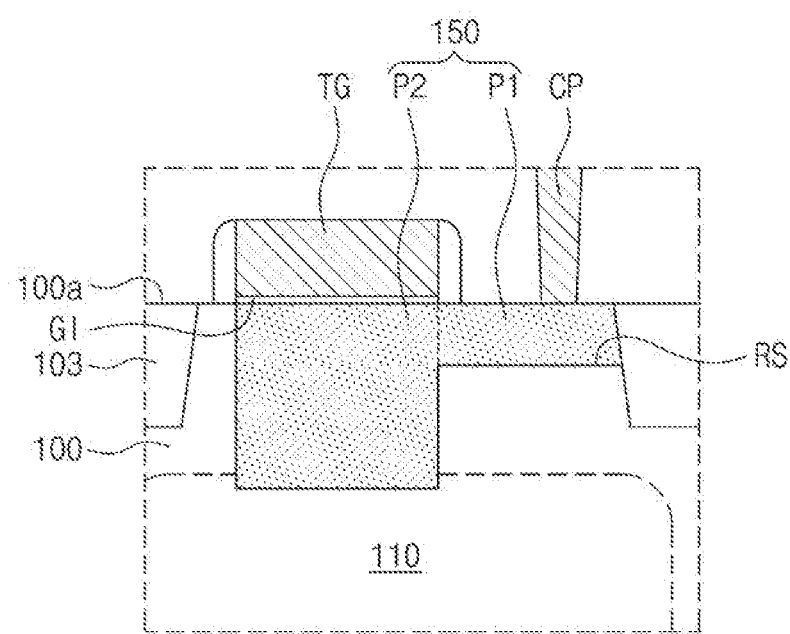

FIG. 6 illustrates a cross-sectional view taken along line I-I' of FIG. 3, showing an image sensor according to some example embodiments. FIGS. 7A to 7C illustrate enlarged views of section BB shown in FIG. 6. For brevity of description, explanations of duplicate components will be omitted.

Referring to FIGS. 6 and 7A, in some embodiments, the transfer gate TG may be disposed on the first surface 100a of the semiconductor substrate 100. The transfer gate TG may have a flat bottom surface. The oxide semiconductor pattern 150 may be buried in the semiconductor substrate 100. A position of a lateral surface 150s of the oxide semiconductor pattern 150 in the semiconductor substrate 100 may be adjacent to a position of the lateral surface TGs of the transfer gate TG (best seen in FIG. 7A).

Referring to FIGS. 6 and 7B, in some embodiments, the oxide semiconductor pattern 150 may include a first part P1 adjacent to the lateral surface TGs of the transfer gate TG and a second part P2 extending from the first part P1 toward a space between the transfer gate TG and the photoelectric conversion region 110. When the first surface 100a is defined as an active surface of the semiconductor substrate 100, a lowermost surface of the second part P2 may be located at a lower level than that of a lowermost surface of the first part P1. The second part P2 may be spaced apart from the photoelectric conversion region 110 by a gap. A portion of the oxide semiconductor pattern 150 may serve as a channel of the transfer transistor TX of FIG. 2.

Referring to FIGS. 6 and 7C, in some embodiments, the second part P2 of the oxide semiconductor pattern 150 may extend into the photoelectric conversion region 110.

Figure 8:
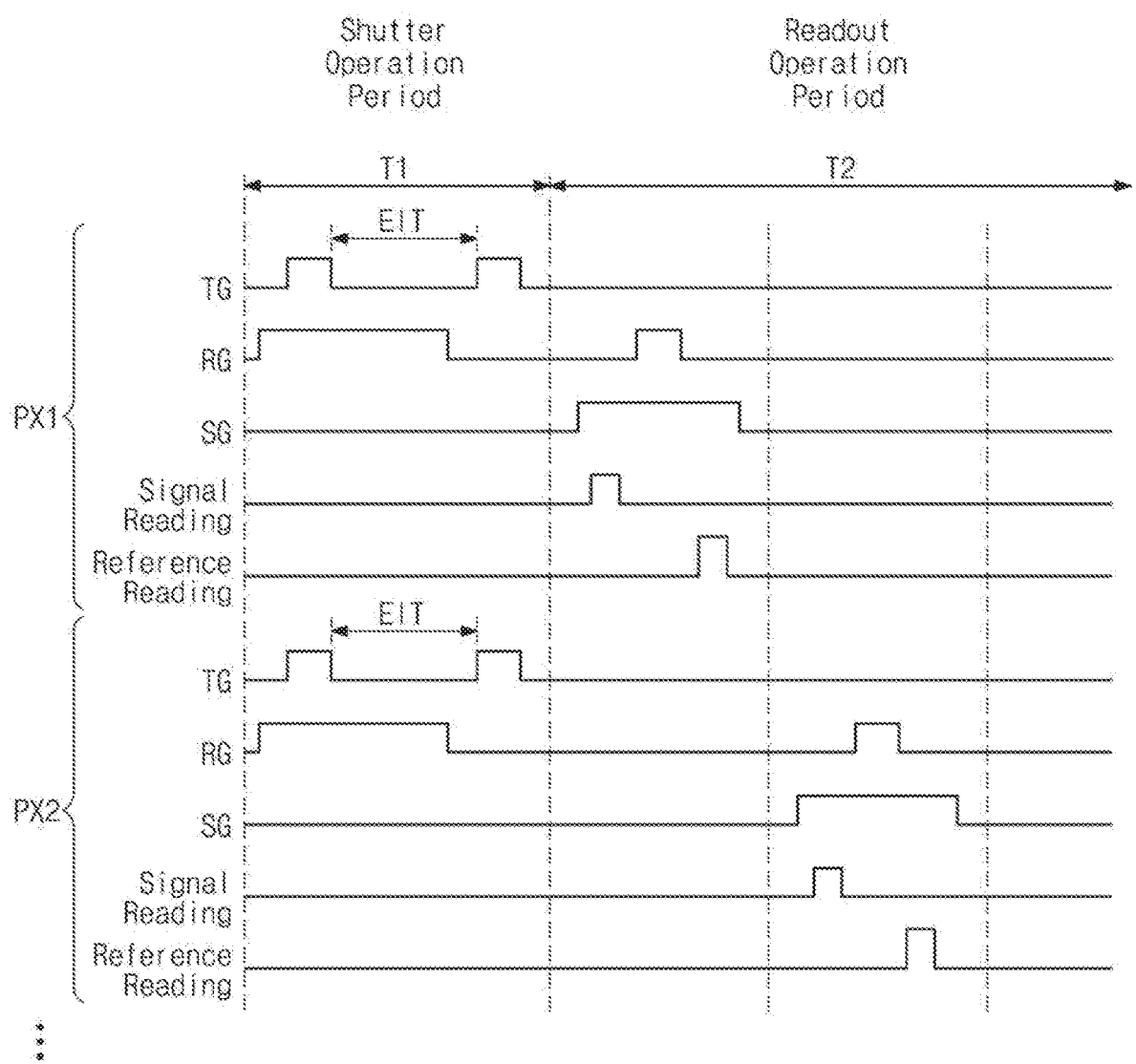
FIG. 8 illustrates a timing diagram showing operation of pixels according to some example embodiments.

FIG. 8 illustrates a timing diagram showing operation of pixels according to some example embodiments. In FIG. 8, a horizontal axis denotes time, and a vertical axis expresses magnitude of signal.

Referring to FIGS. 2, 3, and 8, operation of an image sensor according to some example embodiments may include a shutter operation period T1 and a readout operation period T2.

In the shutter operation period T1, pixels PX1 and PX2 on different columns may be exposed to light at the same time. In addition, the pixels PX1 and PX2 on different columns may accumulate photo-charges during the same photoelectric conversion time. For example, after the photoelectric conversion device PD and the charge storage node FD are reset, an effective integration time (EIT) mode may be performed. The effective integration time (EIT) may denote a period of time during which the transfer transistor TX is turned off and then back on. During the effective integration time (EIT) mode, photo-charges may be accumulated in the charge storage node FD. Each of the pixels PX may create image signals based on the photo-charges stored in the charge storage node FD.

Thereafter, a readout operation may be performed. In the readout operation period T2, the pixels PX1 and PX2 on different columns may sequentially output image signals. The select transistors SX in the pixels PX1 and PX2 on different columns may be sequentially turned on. Image signals created from the source follower transistor SFX may be sequentially output. In an image sensor according to some example embodiments, during the output of image signals created from a first pixel PX1, it may be possible to minimize or prevent loss of image signals stored in a second pixel PX2. As a result, the example embodiments may provide an image sensor capable of performing a global shutter operation and of obtaining sharp images.

Figure 9A:
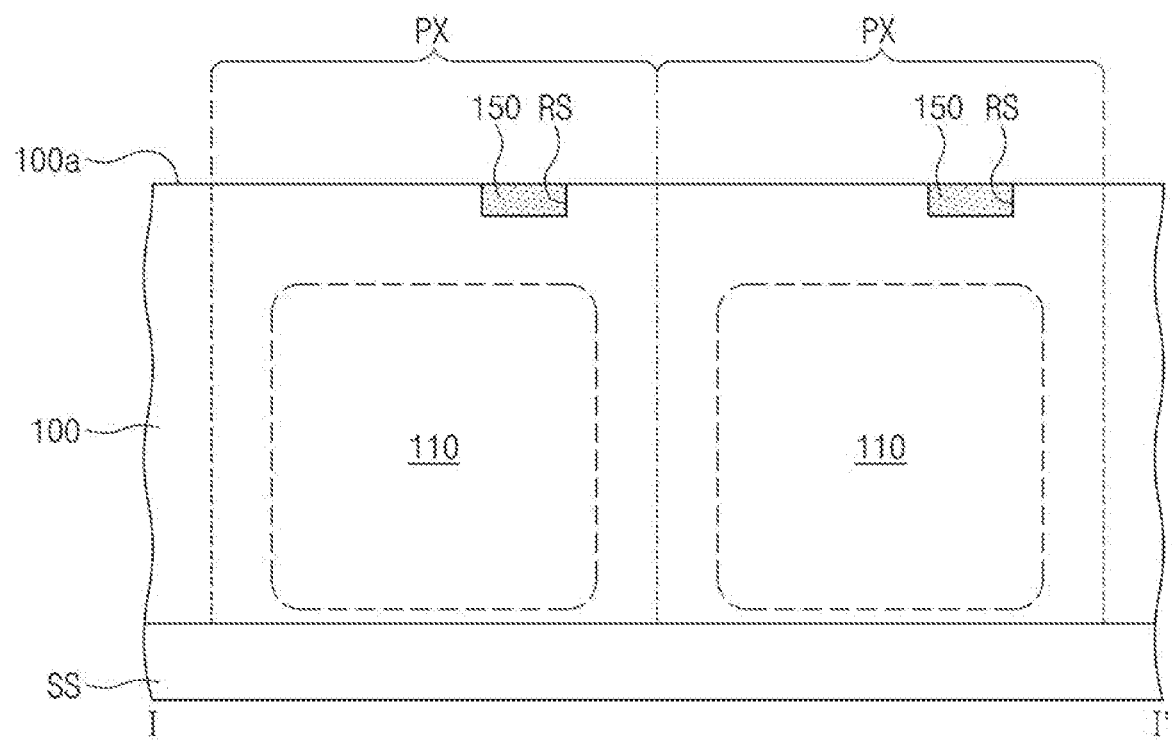
FIGS. 9A, 10A, and 11A illustrate cross-sectional views taken along line I-I' of FIG. 3, showing a method of fabricating an image sensor according to some example embodiments.
Figure 9B:
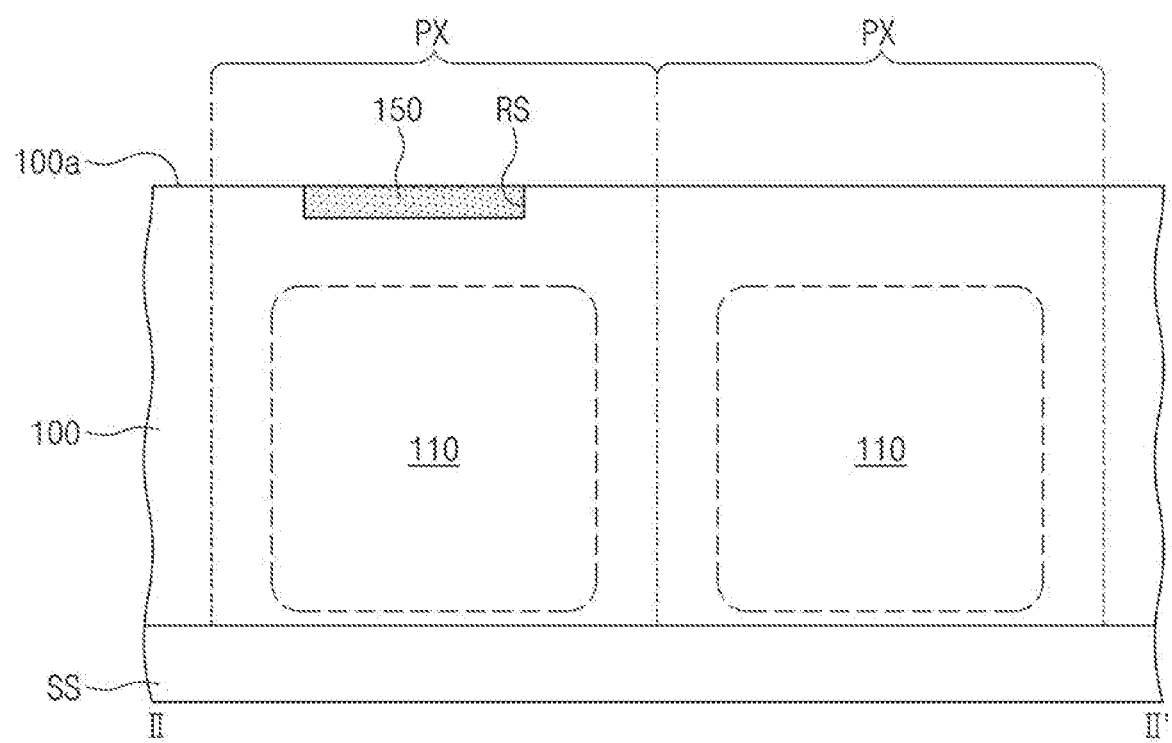
FIGS. 9B, 10B, and 11B illustrate cross-sectional views taken along line II-II' of FIG. 3, showing a method of fabricating an image sensor according to some example embodiments.
Figure 10A:
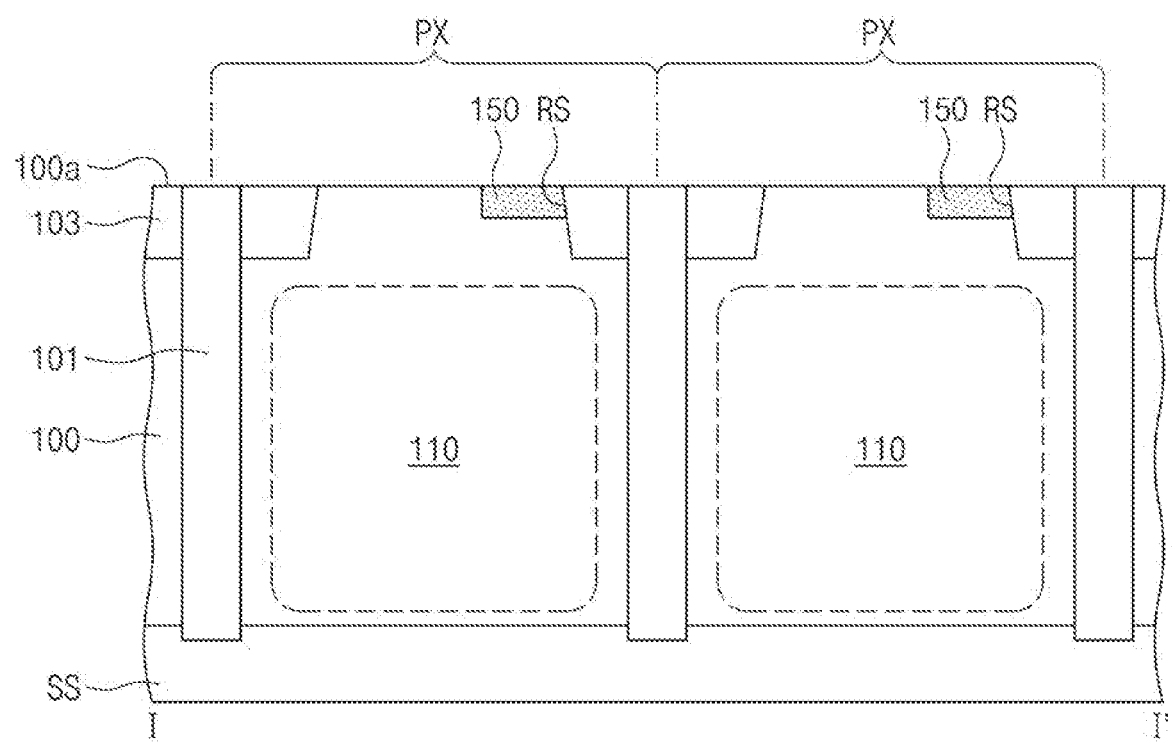
Figure 10B:
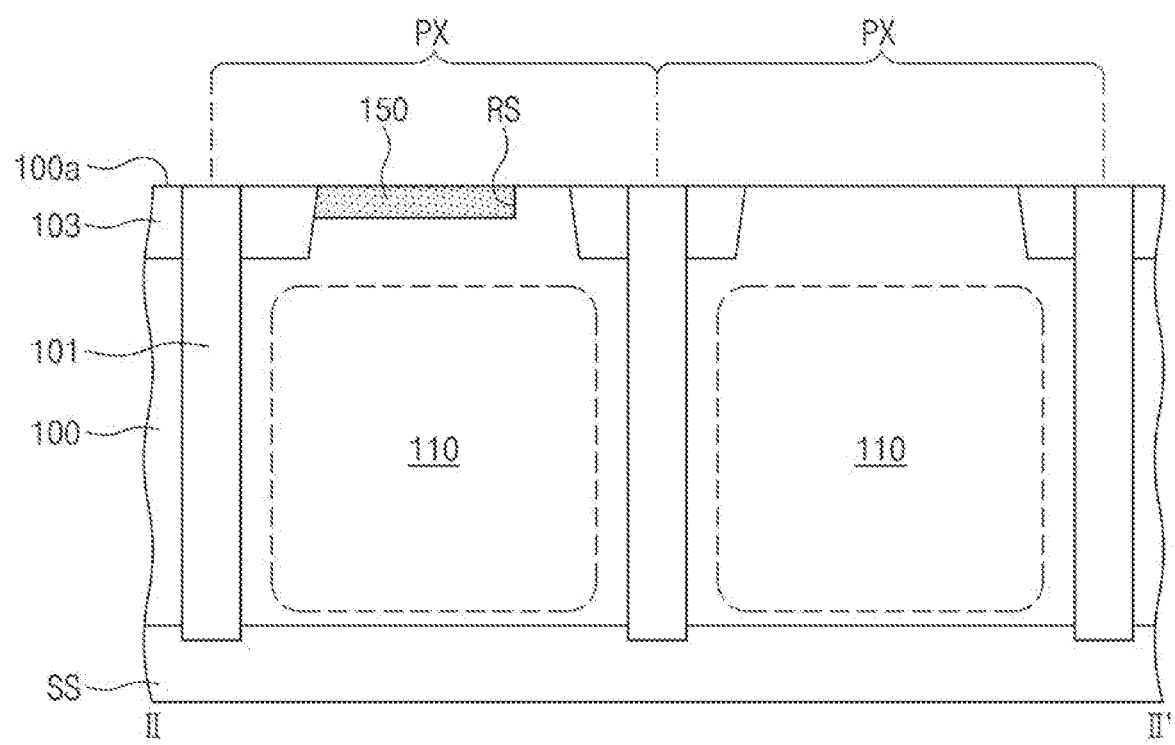
Figure 11A:
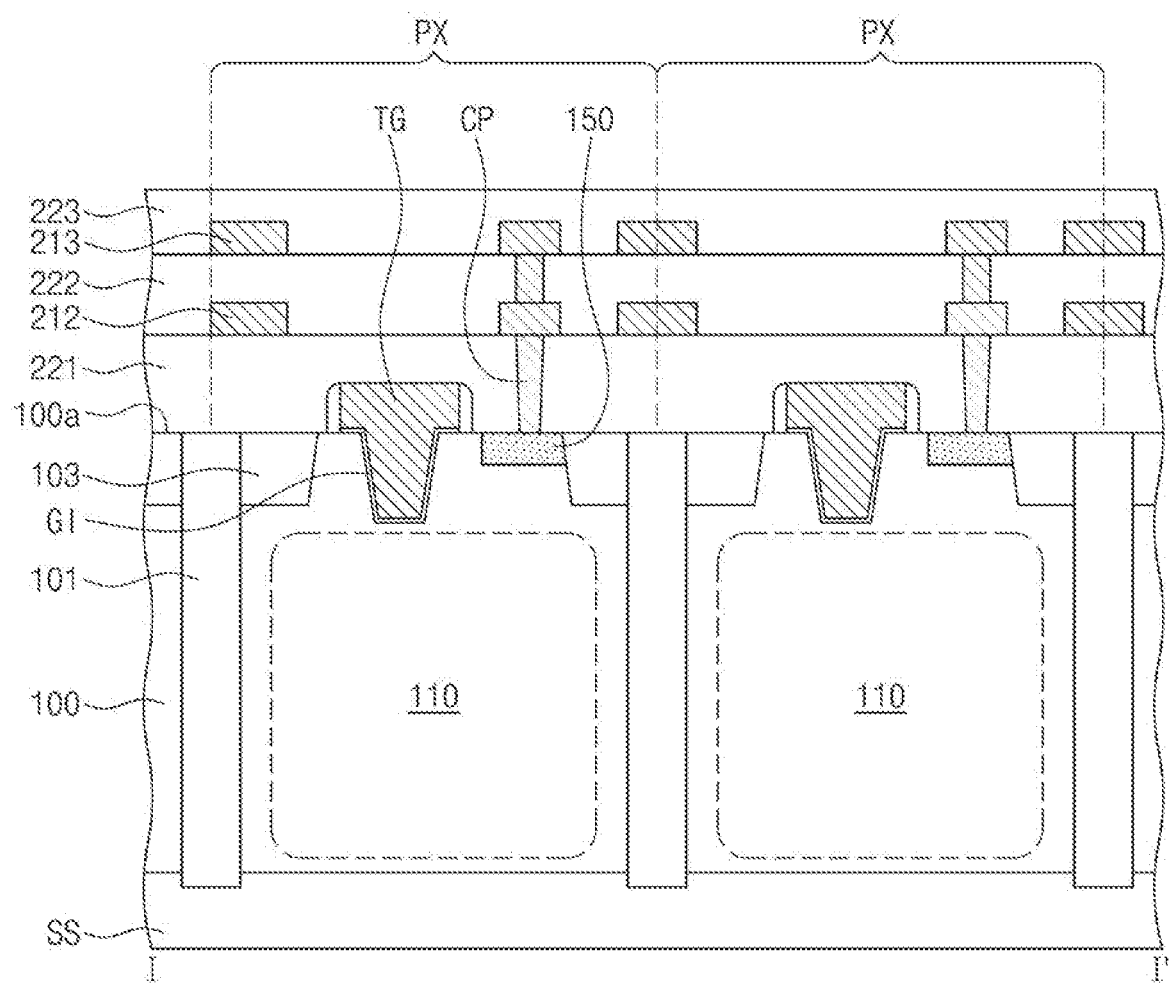
Figure 11B:
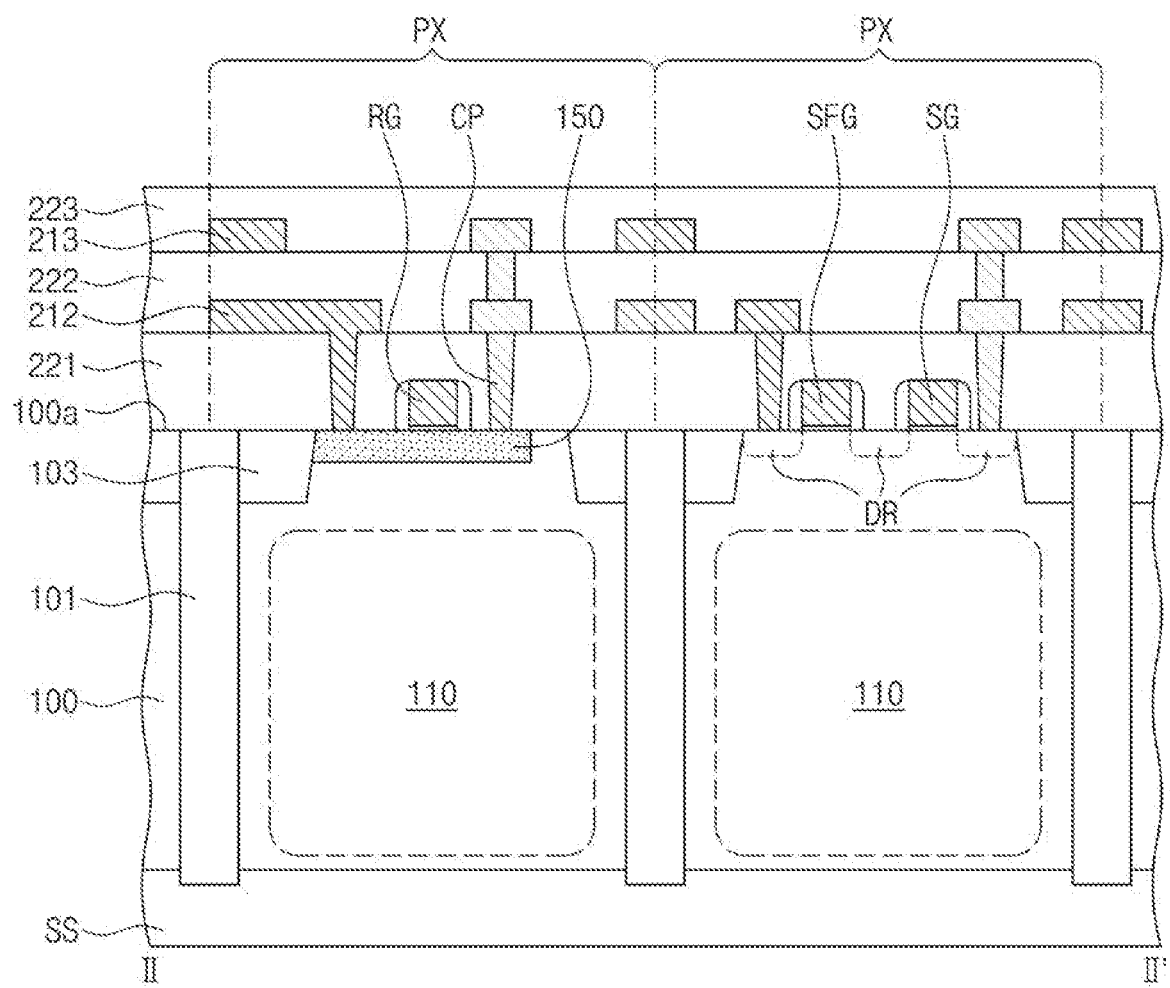

FIGS. 9A, 10A, and 11A illustrate cross-sectional views taken along line I-I' of FIG. 3, showing a method of fabricating an image sensor according to some example embodiments. FIGS. 9B, 10B, and 11B illustrate cross-sectional views taken along line II-II' of FIG. 3, showing a method of fabricating an image sensor according to some example embodiments.

Referring to FIGS. 3, 9A, and 9B, a semiconductor substrate 100 may be provided to have a first conductivity type. For example, the providing of the semiconductor substrate 100 having the first conductivity type may include performing an epitaxial growth process on a sacrificial substrate SS, while in-situ doping the sacrificial substrate SS with impurities having the first conductivity type. The semiconductor substrate 100 may have a first surface 100a and a second surface 100b facing each other. The second surface 100b may be in contact with the sacrificial substrate SS.

Photoelectric conversion regions 110 may be formed in the semiconductor substrate 100. The formation of the photoelectric conversion regions 110 may include forming on the first surface 100a of the semiconductor substrate 100 a mask (not shown) having openings that correspond to pixels PX, and using the mask to dope the semiconductor substrate 100 with impurities having a second conductivity type different from the first conductivity type.

An oxide semiconductor pattern 150 may be formed on the first surface 100a of the semiconductor substrate 100. For example, the formation of the oxide semiconductor pattern 150 may include forming a recess RS that is recessed from the first surface 100a toward the second surface 100b of the semiconductor substrate 100, forming an oxide semiconductor layer (not shown) to fill the recess RS, and performing an etch-back process or a planarization process. The oxide semiconductor layer (not shown) may be formed by, for example, a sputtering process. As another example, the formation of the oxide semiconductor pattern 150 may include forming the oxide semiconductor pattern 150 on the semiconductor substrate 100, performing an epitaxial growth process to form an epitaxial layer (not shown) to cover the oxide semiconductor pattern 150, and performing an etch-back process or a planarization process until the oxide semiconductor pattern 150 is exposed.

Referring to FIGS. 3, 10A, and 10B, first and second device isolation patterns 101 and 103 may be formed between the first and second surfaces 100a and 100b of the semiconductor substrate 100.

The formation of the first device isolation pattern 101 may include forming a deep trench on the first surface 100a of the semiconductor substrate 100 and filling the deep trench with a dielectric layer. The formation of the second device isolation pattern 103 may include forming a shallow trench on the first surface 100a of the semiconductor substrate 100 and filling the shallow trench with a dielectric layer. During the formation of the first and second device isolation patterns 101 and 103, a portion of the oxide semiconductor pattern 150 may be removed.

Referring to FIGS. 3, 11A, and 11B, impurity regions DR may be formed at the first surface 100a of the semiconductor substrate 100. A transfer gate TG, a reset gate RG, a source follower gate SFG, and a select gate SG may be formed on the first surface 100a of the semiconductor substrate 100. The transfer gate TG may be formed to be adjacent to the photoelectric conversion region 110 and the oxide semiconductor pattern 150. The reset gate RG may be formed on the oxide semiconductor pattern 150. The source follower gate SFG and the select gate SG may be formed between the impurity regions DR.

First, second, and third interlayer dielectric layers 221, 222, and 223 may be formed on the first surface 100a of the semiconductor substrate 100. First and second connection lines 212 and 213 may be respectively formed in the second and third interlayer dielectric layers 222 and 223. Contact plugs CP may be formed to connect the connection lines 212 and 213 to the gates TG, RG, SFG, and SG.

Referring back to FIGS. 3, 4A, and 4B, a light transmittance layer 30 may be formed on the second surface 100b of the semiconductor substrate 100. The formation of the light transmittance layer 30 may include sequentially forming a first planarized layer 301, color filters 303, a second planarized layer 305, and micro-lenses 307 on the second surface 100b of the semiconductor substrate 100.

Before the light transmittance layer 30 is formed, a planarization process may be performed on the second surface 100b of the semiconductor substrate 100. The planarization process may remove the sacrificial substrate SS and expose the second surface 100b of the semiconductor substrate 100. A chemical mechanical polishing process may be used to perform the planarization process.

An image sensor according to example embodiments disclosed herein may be configured to minimize or prevent signal loss of pixels. Therefore, the image sensor may be capable of performing a global shutter operation and may have a superior integration.

Although some example embodiments have been discussed with reference to accompanying figures, it will be understood that various changes in form and details may be made therein without departing from the spirit and scope of the present disclosure. It therefore will be understood that the some example embodiments described above are just illustrative but not limitative in all aspects.

What is claimed is:

1. An image sensor comprising:
a semiconductor substrate having a first conductivity type;
a photoelectric conversion region in the semiconductor substrate and having a second conductivity type;
an oxide semiconductor pattern adjacent to a first surface of the semiconductor substrate; and
a transfer gate on the first surface and adjacent to the photoelectric conversion region and the oxide semiconductor pattern,
wherein a lowermost surface of the oxide semiconductor pattern is located at a vertical level between an uppermost surface and a lowermost surface of the transfer gate.

2. The image sensor of claim 1, wherein the transfer gate is configured to provide the oxide semiconductor pattern with charges in the photoelectric conversion region, in response to a signal applied to the transfer gate.

3. The image sensor of claim 1, wherein the oxide semiconductor pattern is disposed in a recess in the semiconductor substrate that is recessed from the first surface of the semiconductor substrate.

4. The image sensor of claim 1, wherein the oxide semiconductor pattern includes indium (In), gallium (Ga), and zinc (Zn).

5. The image sensor of claim 1, wherein a top surface of the oxide semiconductor pattern is coplanar with the first surface of the semiconductor substrate.

6. The image sensor of claim 1, further comprising a reset gate on a top surface of the oxide semiconductor pattern.

7. The image sensor of claim 1, further comprising:
a first contact plug coupled to one end of the oxide semiconductor pattern; and
a second contact plug coupled to another end of the oxide semiconductor pattern.

8. The image sensor of claim 1, wherein
a lower part of the transfer gate is buried inside the semiconductor substrate, and
the oxide semiconductor pattern extends along the lower part of the transfer gate and toward the photoelectric conversion region.

9. The image sensor of claim 1, wherein the oxide semiconductor pattern includes:
a first part to which a contact plug is coupled; and
a second part extending from the first part and downwardly below a bottom surface of the transfer gate,
wherein a second lowermost surface of the second part is located at a lower level than a level of a first lowermost surface of the first part.

10. The image sensor of claim 1, wherein the oxide semiconductor pattern extends into the photoelectric conversion region.

11. The image sensor of claim 1, further comprising:
a first device isolation pattern between the first surface and a second surface of the semiconductor substrate, the first device isolation pattern defining a pixel region; and
a second device isolation pattern disposed in the pixel region and having a depth smaller than that of the first device isolation pattern,
wherein one lateral surface of the oxide semiconductor pattern is in contact with the second device isolation pattern.

12. An image sensor comprising:
a semiconductor substrate having a first surface, and a second surface facing the first surface;
a first device isolation pattern between the first surface and the second surface, the first device isolation pattern defining a pixel;
an oxide semiconductor pattern in the pixel and adjacent to the first surface;
a transfer gate between the oxide semiconductor pattern and the first device isolation pattern; and
a second device isolation pattern between the first device isolation pattern and the oxide semiconductor pattern, the second device isolation pattern having a depth less than that of the first device isolation pattern.

13. The image sensor of claim 12, wherein the oxide semiconductor pattern is disposed in a recess that is recessed from the first surface toward the second surface of the semiconductor substrate.

14. The image sensor of claim 12, wherein one lateral surface of the oxide semiconductor pattern is in contact with the second device isolation pattern.

15. The image sensor of claim 12, wherein a first lowermost surface of the oxide semiconductor pattern is located at a lower level than a level of a second lowermost surface of the second device isolation pattern.

16. The image sensor of claim 12, wherein the oxide semiconductor pattern includes indium-gallium-zinc oxide (IGZO).

17. An image sensor comprising:
a semiconductor substrate having a first surface and a second surface facing each other;
a photoelectric conversion region in the semiconductor substrate;
an oxide semiconductor pattern having a bottom surface in a recess that is recessed from the first surface toward the second surface; and
a transfer gate on the first surface and adjacent to the oxide semiconductor pattern,
wherein an uppermost surface of the oxide semiconductor pattern is coplanar with the first surface of the semiconductor substrate.

18. The image sensor of claim 17, wherein the oxide semiconductor pattern includes indium-gallium-zinc oxide (IGZO).

19. The image sensor of claim 17, further comprising:
a first contact plug coupled to one end of the oxide semiconductor pattern; and a second contact plug coupled to another end of the oxide semiconductor pattern.

* * * * *